US007940001B2

(12) United States Patent
Park et al.

(10) Patent No.: US 7,940,001 B2
(45) Date of Patent: May 10, 2011

(54) FULL-COLOR ORGANIC LIGHT EMITTING DISPLAY AND METHOD OF FABRICATING THE SAME

(75) Inventors: Joon-Young Park, Suwon-si (KR); Jang-Hyuk Kwon, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 537 days.

(21) Appl. No.: 11/227,438

(22) Filed: Sep. 16, 2005

(65) Prior Publication Data

US 2006/0060870 A1    Mar. 23, 2006

(30) Foreign Application Priority Data

Sep. 21, 2004 (KR) .................. 10-2004-0075642

(51) Int. Cl.
 *H01J 1/62* (2006.01)
 *H01J 63/04* (2006.01)
(52) U.S. Cl. ........................ 313/506; 313/504
(58) Field of Classification Search ........... 313/498–512
 See application file for complete search history.

(56) References Cited

U.S. PATENT DOCUMENTS

| | | | |
|---|---|---|---|
| 5,126,214 A | 6/1992 | Tokailin et al. | |
| 5,294,870 A | 3/1994 | Tang et al. | |
| 5,869,928 A * | 2/1999 | Liu et al. | 313/495 |
| 5,869,929 A | 2/1999 | Eida et al. | |
| 5,909,081 A | 6/1999 | Eida et al. | |
| 6,432,516 B1 * | 8/2002 | Terasaki et al. | 428/195.1 |
| 6,506,506 B1 * | 1/2003 | Tomiuchi et al. | 428/690 |
| 6,522,066 B2 | 2/2003 | Sheu et al. | |
| 6,641,933 B1 * | 11/2003 | Yamazaki et al. | 428/690 |
| 6,833,668 B1 * | 12/2004 | Yamada et al. | 313/505 |
| 6,858,464 B2 * | 2/2005 | Yamazaki et al. | 438/89 |
| 6,905,769 B2 * | 6/2005 | Komada | 428/421 |
| 2003/0038590 A1 * | 2/2003 | Silvernail et al. | 313/504 |
| 2003/0071568 A1 * | 4/2003 | Lowery et al. | 313/512 |
| 2004/0051449 A1 * | 3/2004 | Klausmann et al. | 313/512 |
| 2005/0093435 A1 * | 5/2005 | Suh et al. | 313/504 |

FOREIGN PATENT DOCUMENTS

| | | |
|---|---|---|
| CN | 1239396 | 12/1999 |
| CN | 1372434 | 10/2002 |
| CN | 1481205 | 3/2004 |

(Continued)

OTHER PUBLICATIONS http://www.korth.de/eng/503728952d091450d/503728952d0b33731.htm, Korth Kristalle GMBH.*

(Continued)

*Primary Examiner* — Joseph L Williams
*Assistant Examiner* — Zachary Snyder
(74) *Attorney, Agent, or Firm* — Robert E. Bushnell, Esq.

(57) ABSTRACT

A full-color organic light emitting display (OLED) and method of fabricating the same. The display includes a substrate with a pixel electrode, an organic layer having at least an emission layer, and an opposite electrode formed thereon. An encapsulation substrate has formed thereon an organic emission layer that emits light of a single color and a black matrix that defines emission regions. A moisture absorbent material and one of color filter layers and color change mediums are formed between the black matrixes to correspond to the emission layer. The method of making alleviates the need for a separate processes for treating the moisture absorbent material and for forming the color filter layers or the color change mediums using a shadow mask.

21 Claims, 2 Drawing Sheets

FOREIGN PATENT DOCUMENTS

| | | |
|---|---|---|
| JP | 1991-002592 | 1/1991 |
| JP | 2001-126862 | 5/2001 |
| JP | 2001-217072 | 8/2001 |
| JP | 2003-059646 | 2/2003 |
| JP | 2003-142256 | 5/2003 |
| JP | 2003-223992 | 8/2003 |
| JP | 2004-079208 | 3/2004 |
| JP | 2004-095503 | 3/2004 |
| JP | 2004-103514 | 4/2004 |
| JP | 2004-111278 | 4/2004 |

OTHER PUBLICATIONS

Office action from the Korean Intellectual Property Office issued in Applicant's corresponding Korean Patent Application No. 10-2004-0075642 dated Apr. 26, 2006.

Office Action from the Chinese Patent Office issued in Applicant's corresponding Chinese Patent Application No. 2005101097630 dated Feb. 15, 2008.

Office Action from Japanese Patent Office issued in Applicant's corresponding Japanese Patent Application No. 2005-265713 dated on Nov. 25, 2008.

Office action from Japanese Patent Office issued in Applicant's corresponding Japanese Patent Application No. 2005-265713 dated Apr. 21, 2009 and the Request for Entry of the Accompanying Office Action.

Decision to Reject the Amendment from Japanese Patent Office issued in Applicant's corresponding Japanese Patent Application No. 2005-265713 dated Aug. 18, 2009 with Request for Entry of the Accompanying Document.

* cited by examiner

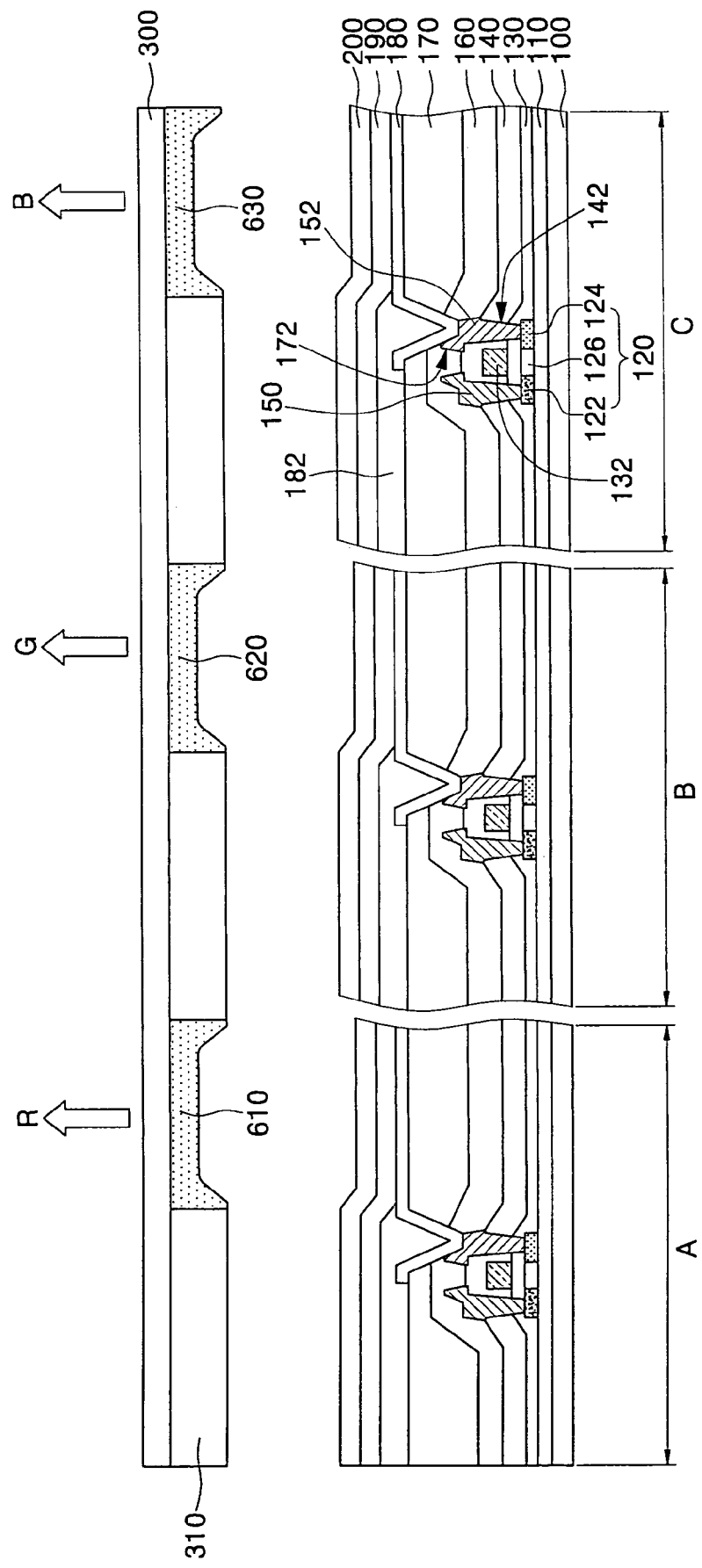

FULL-COLOR ORGANIC LIGHT EMITTING DISPLAY AND METHOD OF FABRICATING THE SAME

CLAIM OF PRIORITY

This application makes reference to, incorporates the same herein, and claims all benefits accruing under 35 U.S.C. §119 from an application for FULL COLOR OLED AND FABRICATING METHOD OF THE SAME earlier filed in the Korean Intellectual Property Office on 21 Sep. 2004 and there duly assigned Serial No. 2004-75642.

BACKGROUND OF THE INVENTION

1. Field of the Invention

The present invention relates to a full-color organic light emitting display (OLED) and method of fabricating the same, the display having an encapsulation substrate that includes a color modification layer having moisture absorbent materials, the color modification layer being either a color filter layer or a color change medium.

2. Description of the Related Art

In general, an OLED includes a substrate, an anode disposed on the substrate, an emission layer disposed on the anode, a cathode disposed on the emission layer, and an encapsulation substrate. In such an OLED, once a voltage is applied between the anode and the cathode, holes and electrons are injected into the emission layer. The holes and electrons are recombined in the emission layer to generate excitons. When the excitons change from an exited state to a ground state, light is emitted.

In order to realize a full-color OLED, respective emission layers corresponding to red (R), green (G), and blue (B) colors can be formed. However, since the respective emission layers corresponding to red (R), green (G), and blue (B) colors have life spans different from one another, it is difficult to keep white balance after the OLED is driven for a long time. In addition, because of a technical limit for forming fine patterns in each pixel, it is difficult to fabricate high-resolution display devices.

To solve these problems, a new method of fabricating a full-color OLED was proposed. The method includes forming an emission layer that emits light of a single color, and forming a color filter layer that extracts light of a predetermined color from the light emitted by the emission layer. Instead of a color filter layer, a color conversion layer that converts the light emitted by the emission layer into light of a predetermined color can be used. As an example, U.S. Pat. No. 6,522,066 to Sheu et al includes an emission layer emitting blue light and a color conversion layer formed using photolithography.

Meanwhile, in the OLED, an encapsulation substrate is attached to a substrate such that an anode, an emission layer, and a cathode formed on the substrate are protected. However, I have found that such a structure deteriorates quickly because moisture and oxygen tend to destroy the emission layer. Therefore, what is needed is an improved design for an OLED and an improved method of making the same where the emission layer can be protected from moisture and oxygen.

SUMMARY OF THE INVENTION

It is therefore an object of the present invention to provide an improved design for an OLED.

It is also an object of the present invention to provide a method of making the improved OLED.

It is still an object of the present invention to provide a design for an OLED where the emission layer is protected from moisture and oxygen.

It is further an object of the present invention to provide a method of making the OLED having the emission layer protected from moisture and oxygen.

It is yet an object of the present invention to provide a method of making the novel OLED that is less expensive and less complicated to make.

These and other objects can be achieved by a full-color OLED and method of fabricating the same, in which a moisture absorbent material and either color change mediums or color filter layers are formed on an encapsulation substrate, thus facilitating alignment during an encapsulation process and resulting in high-resolution OLEDs.

In an exemplary embodiment of the present invention, the full-color OLED includes a substrate on which a pixel electrode, an organic layer having at least an emission layer, and an opposite electrode are arranged thereon, an encapsulation substrate corresponding to and attached to the substrate, a black matrix arranged on the encapsulation substrate, the black matrix being adapted to define an emission region, and color modification layers comprising a moisture absorbent material arranged between the black matrixes to correspond to the emission region, wherein the emission layer of the organic layer is adapted emit light of a single color, the color modification layers being one of color filter layers and color change mediums.

In another exemplary embodiment of the present invention, a method of fabricating a full-color OLED includes forming a structure on a substrate, forming a pixel electrode on the structure and on the substrate, forming an organic layer on the pixel electrode, the organic layer comprising at least an emission layer, forming an opposite electrode on the organic layer, forming a black matrixes on an encapsulation substrate corresponding to the substrate, the black matrixes for defining an emission region, forming color modification layers between the black matrixes and on the encapsulation substrate, and forming a moisture absorbent material on the color modification layers, the color modification layers being one of color filter layers and color change mediums, wherein the color modification layers are mixed with the moisture absorbent material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 2 is a schematic cross-sectional view of a full-color OLED according to another exemplary embodiment of the present invention.

DETAILED DESCRIPTION OF THE INVENTION

Figure 1:
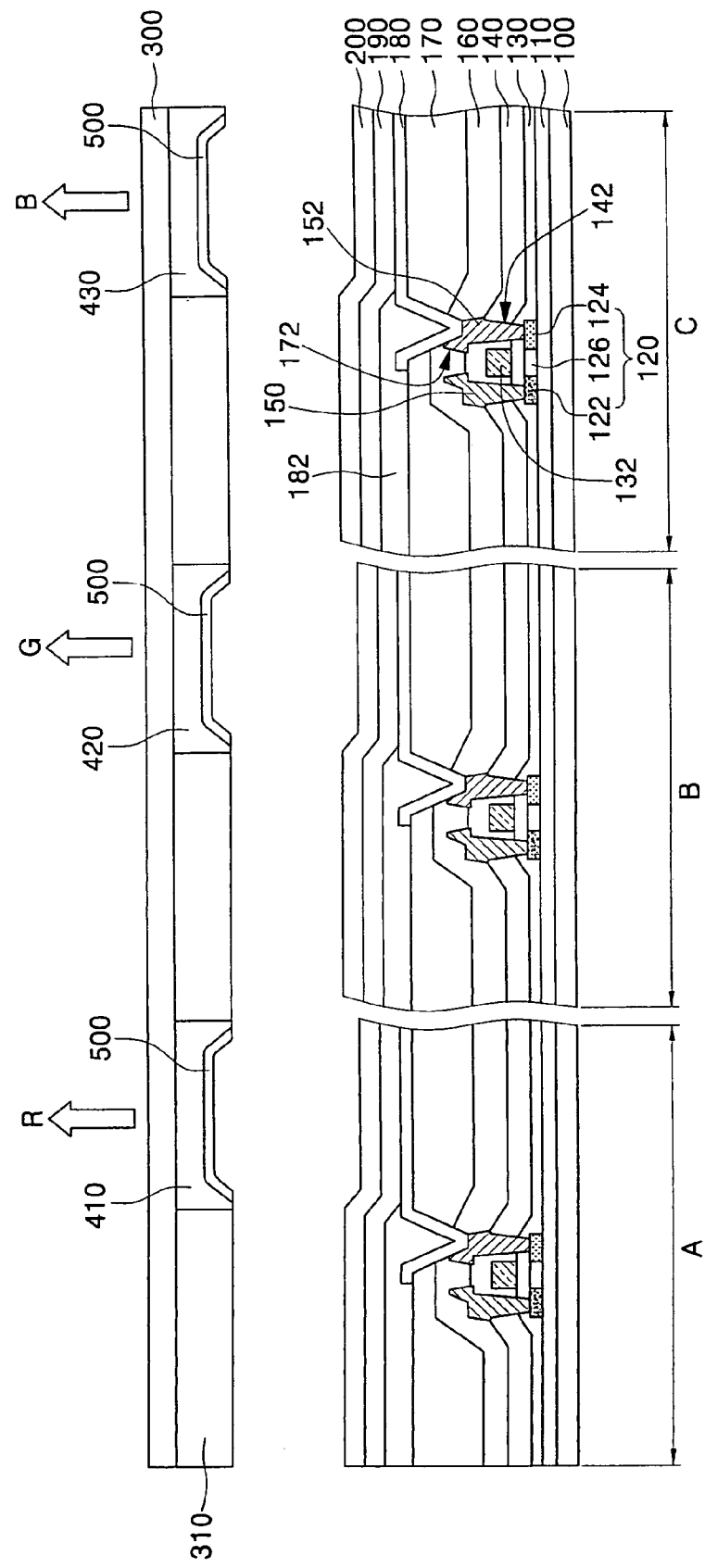
FIG. 1 is a schematic cross-sectional view of a full-color OLED according to an exemplary embodiment of the present invention.

Turning now to FIG. 1, FIG. 1 is a schematic cross-sectional view of a full-color OLED according to an exemplary embodiment of the present invention. Referring to FIG. 1, the full-color OLED includes a substrate 100 and an encapsulation substrate 300. The substrate 100 includes a thin-film transistor (TFT) formed thereon. On substrate 100 is a gate electrode 132, a source electrode 150, a drain electrode 152, a pixel electrode 180 that is connected to any one of the source and drain electrodes 150 and 152, an organic emission layer 190 and an opposite electrode 200. The organic emission layer 190 and the opposite electrode 200 are disposed on top of the pixel electrode 180.

On the encapsulation substrate 300 of the OLED of FIG. 1 are color modification layers 410, 420 and 430. The color modification layers 410, 420 and 430 can be one of color filter layers or a color change mediums. The color modification layers 410, 420 and 430 also include moisture absorbent materials 500 at a location that corresponds to the organic emission layer 190. In the embodiment of FIG. 1, the organic emission layer 190 emits light of a single color. The single color can be one of blue light or white light. The color modification layers 410, 420, and 430 produce red, green and blue light from the light emitted by the organic emission layer 190.

In the embodiment of FIG. 1, the moisture absorbent materials 500 are formed as a separate layer from the color modification layers 410, 420, and 430. In the OLED of FIG. 1, the moisture absorbent materials 500 can be formed on the color modification layers 410, 420 and 430 or on an entire surface of the encapsulation substrate 300 bearing the color modification layer 410, 420 and 430. In another embodiment of FIG. 2, absorbent materials are mixed into the color modification layers 610, 620, and 630 as opposed to being formed as a separate layer. In the embodiment of FIG. 2, the color modification layers 610, 620 and 630 are formed on encapsulation substrate 300.

Referring now to FIG. 1, black matrixes 310 are disposed on one surface of the encapsulation substrate 300 and define emission regions, and the color modification layers 410, 420 and 430 are disposed in the emission regions between the black matrixes 310. The black matrixes 310 prevent color filters from interfering with each other and prevent the emission regions from being damaged by external pressure.

When color filter layers are used as the color modification layers 410, 420, and 430, the color filter layers contain pigments and polymer binders. The color filter layers can be classified into a red color filter layer 410, a green color filter layer 420, and a blue color filter layer 430 according to the type of the pigment. The red, green, and blue color filter layers 410, 420, and 430 pass only red, green and blue components of light incident from the organic emission layer 190, respectively.

When color filter layers are used, the color filter layers 410, 420, and 430 can be formed by a laser induced thermal imaging method. A process of forming the color filter layers 410, 420, and 430 using the laser induced thermal imaging method will now be described. First, a donor film is prepared. To prepare the donor film, a light-to-heat conversion layer is formed on a base film, and a transfer layer for a color filter layer is formed on the light-to-heat conversion layer. After that, the donor film is positioned on a substrate such that the transfer layer for the color filter layer faces the encapsulation substrate 300, and laser beams are irradiated on the base film of the donor film. Thus, the transfer layer for the color filter layer is transferred onto the encapsulation substrate 300, thus forming the color filter layers. In this process, each of the red color filter layer 410, the green color filter layer 420, and the blue color filter layer 430 is formed on the encapsulation substrate 300. Alternatively, the color filter layers 410, 420, and 430 can instead be formed by photolithography with repeated exposure and development cycles or by using an inkjet.

When color change mediums are instead used for the color modification layers 410, 420, and 430, the color change mediums can contain fluorescent materials and polymer binders. The fluorescent materials are excited by light incident from the organic emission layer 190 and emit light having a longer wavelength than that of the incident light upon transition from an excited state to a ground state. The color change mediums 410, 420, and 430 are divided into a red color conversion layer 410, a green color conversion layer 420, and a blue color conversion layer 430 according to the type of the fluorescent material. The red, green, and blue conversion layers 410, 420, and 430 convert the incident light into red, green, and blue light, respectively.

Like the color filter layers, the color change mediums 410, 420, and 430 can be formed by laser induced thermal imaging, photolithography, or an inkjet method. When the color filter layers are formed using laser induced thermal imaging, the color change mediums 410, 420, and 430 are formed in the same manner as the color filter layers except that the transfer layer for a color change medium is formed on a base film.

The organic emission layer 190 that emits light of a single color can be formed of two or more organic thin layers, each of which emits light of a different wavelength range, so that light of a single color can be emitted. Alternatively, the organic emission layer 190 can be formed of polymer materials and/or monomer materials and be deposited on the entire surface of the substrate 100 using spin-coating or vacuum deposition.

The organic emission layer 190 can be formed such that one of white light and blue light is emitted. When the color filter layers are used for the color modification layers, the organic emission layer 190 is made to emit only white light. When the color change mediums are used as the color modification layers, the organic emission layer 190 is made so that only blue light is emitted.

A method of fabricating the full-color OLEDs of FIGS. 1 and 2 will now be described. Referring to FIG. 1, TFTs are formed on substrate 100 to correspond to a red pixel region A, a green pixel region B and a blue pixel region C. This begins with forming a buffer layer 110 to a predetermined thickness on a substrate 100. The buffer layer 110 prevents diffusion of impurities from the substrate 100 into a TFT to be formed above.

Poly crystalline Si (poly-Si) patterns 120 are formed on the buffer layer 110, and impurities are implanted into both marginal portions of each of the poly-Si patterns 120 so that a source region 122 and a drain region 124 are formed in each of the pixel regions A, B, and C. As illustrated in FIGS. 1 and 2, a channel region 126 is located between the source and drain regions 122 and 124. Thereafter, a gate insulating layer 130 is formed on the entire surface of the resultant structure, and a gate electrode 132 is formed to correspond to the channel region 126 of each of the poly-Si patterns 120.

An interlayer insulating layer 140 is formed on the entire surface of the resultant structure and etched to form contact holes 142 to expose the source and drain regions 122 and 124. After that, source and drain electrodes 150 and 152 are formed to be in contact with the source and drain regions 122 and 124 through the contact holes 142, respectively.

Next, a passivation layer 160 and a planarization layer 170 are formed on the entire surface of the resultant structure. The passivation layer 160 and the planarization layer 170 are etched to form via holes 172 to expose the drain electrodes 152. Thereafter, in each of the pixel regions A, B, and C, a pixel electrode 180 is formed to be in contact with the corresponding drain electrode 152 through the corresponding via hole 172. The pixel electrode 180 is preferably a reflective electrode. A pixel defining layer pattern 182 that defines the emission region is formed on the entire surface of the resultant structure except a portion of the pixel electrode 180. On the entire surface of the resultant structure, an organic layer 190 having at least an emission layer and an opposite electrode 200 are formed. The organic layer 190 includes an emission layer that emits either blue light or white light. A transparent passivation layer (not shown) is formed on the opposite electrode 200.

Thereafter, an encapsulation substrate 300 corresponding to the substrate 100 is prepared. The encapsulation substrate 300 is preferably a transparent substrate. On one surface of the encapsulation substrate 300, black matrixes 310 are formed that define emission regions corresponding to the emission regions on the substrate 100. The black matrixes 310 can be formed of $Cr/CrO_x$ and patterned by a photolithography process. Subsequently, the color modification layers 410, 420 and 430 are formed at portions corresponding to the emission regions of the substrate 100, i.e., between the black matrixes 310.

When the emission layer 190 emits white light, the color filter layers are formed on the encapsulation substrate 300 and serve as the color modification layers 410, 420 and 430. When the emission layer 190 emits blue light, the color change mediums are formed on the encapsulation substrate 300 and serve as the color modification layers 410 and 420. However, when the emission layer emits blue light, the color change medium or color conversion layer can not be formed on a portion of the encapsulation substrate 300 corresponding to the blue pixel region C, and thus layer 430 is not formed. The color modification layers 410, 420 and 430, whether they are color filter layers or color change mediums, can be formed by a laser induced thermal imaging method, a photolithography method, or an inkjet method.

Next, moisture absorbent materials 500 are formed on the color modification layers 410, 420, and 430 or on the entire surface of the resultant structure including the same. The moisture absorbent material 500 is a transparent material that contains elements that absorb both moisture and oxygen. The moisture absorbent material 500 can be a nanograin absorbent containing $SiO_2$ as a main element, a chemical reaction type absorbent containing a CaO dispersing agent as a main element, a nanograin absorbent containing $SiO_2$ and $CaCl_2$ as main elements, a chemical reaction type absorbent containing $SiO_2$ and $CaCl_2$ as the main elements, or an organic-inorganic absorbent us containing an organic-inorganic composite absorbent as the main element. Since the moisture absorbent material 500 is a transparent material, it can instead be mixed into the color modification layers 610, 620, and 630 when applied to the surface of the encapsulation substrate 300 as in FIG. 2.

Table 1 shows the main elements, accelerated lifetime of test cells, and coating methods of the moisture absorbent material 500.

TABLE 1

|  | Main element | Accelerated lifetime of test cells (hr) | Coating method |
| --- | --- | --- | --- |
| Nanograin absorbent | $SiO_2$ | 75 | Screen printing |
| Nanograin/chemical reaction type absorbent | $SiO_2 + CaCl_2$ | 168 | Screen printing |

TABLE 1-continued

|  | Main element | Accelerated lifetime of test cells (hr) | Coating method |
| --- | --- | --- | --- |
| Chemical reaction type absorbent | CaO dispersing agent | 560 | Spray coating |
| Organic-inorganic absorbent | Organic-inorganic composite absorbent | 400 | Screen printing |

By forming the moisture absorbent materials 500 on the color modification layers 410, 420, and 430 of the encapsulation substrate 300 as described above, no additional spaces for mounting the moisture absorbent materials 500 are needed, and physical damage to the color modification layers 410, 420, and 430 can be prevented.

In the exemplary embodiments of the present invention as described above, color modifications layers, which can be either color filter layers or color change mediums, are formed on an encapsulation substrate, and transparent moisture absorbent materials are formed on or in the color modification layers. As a consequence, full-color OLEDs can be fabricated in a simple process to produce a high-resolution display without adversely affecting optical characteristics.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A display, comprising:
a substrate on which a pixel electrode, and an organic layer having at least an emission layer, are arranged thereon and an opposite electrode is arranged directly upon the organic layer;
an encapsulation substrate corresponding to and attached to the substrate;
a plurality of black matrixes arranged on the encapsulation substrate, the black matrixes being adapted to define an emission region; and
a plurality of color modification layers arranged between ones of the black matrixes to correspond to the emission region, wherein the emission layer of the organic layer is adapted to emit light of a single color, and the plurality of color modification layers are color change mediums including a moisture absorbent material arranged only within the plurality of color modification layers and not on the black matrixes.

2. The display of claim 1, further comprising a thin-film transistor arranged between the substrate and the pixel electrode and electrically connected to the pixel electrode.

3. The display of claim 1, wherein the pixel electrode is a reflective electrode, and the opposite electrode is a transparent electrode.

4. The display of claim 1, wherein the emission layer emits blue light.

5. The display of claim 1, wherein the moisture absorbent material is a transparent material that comprises elements that absorb moisture and oxygen.

6. The display of claim 1, wherein the moisture absorbent material comprises at least one material selected from a group consisting of a nanograin absorbent, a chemical reaction type absorbent and an organic-inorganic absorbent.

7. The display of claim 1, wherein the moisture absorbent material is further arranged on an entire surface of the color modification layers.

8. The display of claim 1, wherein the moisture absorbent material comprises a material selected from a group consisting of $SiO_2$, CaO and $CaCl_2$.

9. A method, comprising:
   forming a structure on a substrate;
   forming a pixel electrode on the structure and on the substrate;
   forming an organic layer on the pixel electrode, the organic layer including at least an emission layer;
   forming an opposite electrode directly on the organic layer;
   forming a plurality of black matrixes on an encapsulation substrate that corresponds to the substrate, the black matrixes being adapted to define an emission region;
   forming color modification layers on the encapsulation substrate and between the black matrixes; and
   forming a moisture absorbent material on the color modification layers and in between adjacent ones of the plurality of black matrixes, the color modification layers being color change mediums.

10. The method of claim 9, the structure comprising at least one thin-film transistor.

11. The method of claim 9, wherein the pixel electrode is a reflective electrode, and the opposite electrode is a transparent electrode.

12. The method of claim 9, wherein the emission layer of the organic layer emits blue light.

13. The method of claim 9, wherein the moisture absorbent material is comprised of a material selected from a group consisting of CaO, $SiO_2$, $CaCl_2$ and an organic-inorganic composite absorbent.

14. The method of claim 9, wherein the moisture absorbent material comprises a transparent material that absorbs moisture and oxygen.

15. The method of claim 9, wherein the moisture absorbent material comprises at least one material selected from a group consisting of a nanograin absorbent, a chemical reaction type absorbent, or an organic-inorganic absorbent.

16. The method of claim 9, wherein the moisture absorbent material is formed by one of a screen printing method and a spray coating method, the moisture absorbent material being CaO.

17. The method of claim 9, wherein the moisture absorbent material is formed on an entire surface of the resultant structure having the color modification layers.

18. The method of claim 9, wherein the color modification layers are mixed with the moisture absorbent material.

19. The display of claim 1, wherein the plurality of black matrixes being absent of the moisture absorbent material.

20. The method of claim 9, the moisture absorbent material being arranged only on and not within the color modification layers.

21. The method of claim 9, wherein the moisture absorbent material is arranged only between adjacent ones of the plurality of black matrixes and on top of the color modification layers.

* * * * *